US012597943B2

(12) United States Patent
Fronczak

(10) Patent No.: US 12,597,943 B2
(45) Date of Patent: Apr. 7, 2026

(54) RAMP CIRCUIT

(71) Applicant: ams Sensors Belgium BVBA, Antwerp (BE)

(72) Inventor: Kevin Fronczak, Fairport, NY (US)

(73) Assignee: ams Sensors Belgium BVBA, Antwerp (BE)

( * ) Notice: Subject to any disclaimer, the term of this patent is extended or adjusted under 35 U.S.C. 154(b) by 248 days.

(21) Appl. No.: 18/557,619

(22) PCT Filed: Apr. 27, 2022

(86) PCT No.: PCT/EP2022/061253
§ 371 (c)(1),
(2) Date: Oct. 27, 2023

(87) PCT Pub. No.: WO2022/229285
PCT Pub. Date: Nov. 3, 2022

(65) Prior Publication Data
US 2024/0223204 A1 Jul. 4, 2024

(30) Foreign Application Priority Data

Apr. 30, 2021 (GB) ..................................... 2106220

(51) Int. Cl.
*H03M 1/12* (2006.01)
*H03M 1/00* (2006.01)
*H03M 1/06* (2006.01)

(52) U.S. Cl.
CPC ......... *H03M 1/1255* (2013.01); *H03M 1/002* (2013.01); *H03M 1/0668* (2013.01)

(58) Field of Classification Search
CPC ... H03M 1/1255; H03M 1/002; H03M 1/0668
USPC .......................................................... 341/155
See application file for complete search history.

(56) References Cited

U.S. PATENT DOCUMENTS

| | | |
|---|---|---|
| 2006/0001564 A1 | 1/2006 | Yamagata et al. |
| 2012/0127356 A1 | 5/2012 | Matsuura |
| 2017/0280077 A1* | 9/2017 | Yun ...................... H04N 25/616 |
| 2019/0394415 A1 | 12/2019 | Liu |
| 2020/0295739 A1 | 9/2020 | Zuo et al. |

OTHER PUBLICATIONS

International Search Report for corresponding International Application PCT/EP2022/061253, dated Aug. 29, 2023, 3 pages (for informational purposes only).

* cited by examiner

*Primary Examiner* — Peguy Jean Pierre
(74) *Attorney, Agent, or Firm* — Viering, Jentschura & Partner mbB

(57) ABSTRACT

Disclosed herein is a ramp circuit for an analogue to digital converter, ADC. The ramp circuit includes a ramp unit configured to provide a ramp signal usable for sampling an analogue signal. The ramp circuit also includes a hold unit connected to the ramp unit, the hold unit is configured to hold a reference voltage for resetting the ramp signal between subsequent samplings of the analogue signal.

15 Claims, 8 Drawing Sheets

RAMP CIRCUIT

CROSS-REFERENCE TO RELATED APPLICATION(S)

This application is a national phase application of PCT/EP2022/061253, filed on Apr. 27, 2022, which claims priority to UK Patent Application GB2106220.3 filed on Apr. 30, 2021, the contents of both which are fully incorporated herein by reference.

FIELD OF DISCLOSURE

The invention concerns ramp circuits for analogue to digital converters, for example in a sensor read-out circuit.

BACKGROUND

An analogue to digital converter (ADC) can be composed of three parts: a ramp generator, a comparator, and a counter. The analogue pixel value is compared to an analogue ramp. The counter stops counting when the pixel value is equal to the ramp value. Then the value in the counter becomes the converted value.

The ADC is a critical block of the sensor, being the bottleneck to increase the frame rate. It can also be responsible for increased noise. For example, Vertical Fixed Pattern Noise (VFPN) and line noise mostly depend on the ADC design. The VFPN is due to the column-to-column mismatch of the comparator. To remove this noise, Correlated Double Sampling (CDS) may be used. The CDS involves performing the conversion twice: once for the reference level of the pixel (or reset level) and once for the pixel signal level.

Using CDS, row temporal noise (RTN) may become a problem. RTN can be reduced by minimising the reference noise and amplifier noise, but this requires high design effort.

SUMMARY

It is an object of the disclosure to provide a ramp circuit for ADC that solves at least some of the above mentioned problems.

Embodiments of the circuit can provide low area impact and minimise power by hardware re-use. It also has the ability to work with both digital and analogue CDS architectures, which has not been possible in conventional solutions for addressing RTN with CDS. Furthermore, the circuit can be implemented in both single ended and differential architectures.

According to a first aspect of the present disclosure there is provided a ramp circuit for an analogue to digital converter, ADC. The ramp circuit comprises a ramp unit configured to provide a ramp signal usable for sampling an analogue signal, and a hold unit connected to the ramp unit and configured to hold a reference voltage for resetting the ramp signal between subsequent samplings of the analogue signal.

During typical use, the ramp unit applies a linearly decreasing ramp signal to one input of a comparator while the analogue signal to be converted (e.g. a pixel signal) is applied to the other input. When the signals are equal the comparator output switches (e.g. 1 to 0). A counter is used to count the time for the ramp signal to equal the analogue signal. Conventionally, a voltage reference source applies a reference voltage to reset the ramp signal between subsequent samplings. However, this can increase noise, and the embodiments described herein therefore use a hold unit instead to hold the reference voltage between two samplings. Typically, the ADC will use correlated double sampling (CDS) to remove any offset, wherein a reference signal is sampled and subtracted from the analogue signal. For example, CDS can be used to sample the pixel signal and the pixel reset signal and then subtract the pixel reset signal from the pixel signal.

The disclosed embodiments can provide a number of technical advantages, such as cancelling RTN noise due to sampling the reference voltage. The embodiments work with single-ended ADCs as well as with differential ADCs. Also, when the reference voltage is sampled, the voltage reference source can be disabled for power savings. This can be done at row or frame level (e.g. for 1 fps event detection, the voltage reference source may only be active/enabled at the start of frame during sampling). This can bring the reference power contribution to the overall system power budget near 0%.

While use of a simple sample and hold circuit S/H (e.g. a single switch and capacitor) may be used for short row times (i.e. short holding times), leakage will cause row FPN. This effect is expected to be consistent from row-to-row within a frame, so a temperature-varying frame offset will appear. To solve this problem, a hold unit that can provide a relatively long sample and hold is provided by removing leakage paths.

The ramp unit may comprise an operational amplifier (op-amp) and the hold unit may comprise a hold capacitor for holding the reference voltage and connected to an input of the op-amp, a first switch connected to the hold capacitor; a second switch connected in series between the first switch and a reference voltage source, so that the hold capacitor and the input of the op-amp are connected to the reference voltage source when the first and second switches are closed, and a third switch connected between an output of the op-amp and a point between the first switch and the second switch, such that the first and second switches are connected to the output of the op-amp when the third switch is closed. The switches of the hold unit are typically semiconductor switches (e.g. bipolar junction transistors, BJT, or field effect transistor, FET). The third switch allows the output from the op-amp to be applied to the first switch, which balances the potential on both sides of the first switch and thereby prevents leakage.

With this ramp circuit, 100's of ms hold time is achievable, which can be used in either event detection mode or another low power mode (especially where image quality is not critical). For example, the circuit can be used for frame-level holding, where the voltage reference source (e.g. VDAC) is sampled before a frame and then disabled for power savings. The ramp circuit can be particularly useful for event detection modes.

By controlling the order and timing of the switches, kickback concerns can be eliminated or reduced. Each row conversion "sees" the same thing (same noise and disturbance from switches), which can therefore be cancelled by CDS. Another advantage is that the disclosed ramp circuit is that it is inherently backwards compatible with existing ADCs and sensor architectures. The first and second switch can be kept closed for legacy mode. Then the switches can be pulsed per row read for S/H operation.

The ramp unit typically comprises a first ramp switch for selectively applying a ramp voltage to a comparator, and a second ramp switch connected to a current sink for selectively decreasing the ramp voltage applied to the comparator. The first and second ramp switches are typically inversely coupled, so that the first ramp switch is open when the second ramp switch is closed and vice versa. Hence, the ramp switches can be used to switch between applying a constant voltage and a (linearly) decreasing voltage.

The ramp circuit can be configured to perform the following steps in the following order:

open the first switch of the hold unit;

open the second switch of the hold unit;

close the third switch of the hold unit; and open the first ramp switch and close the second ramp switch. The phase during which these steps occur may be referred to as the "non-overlap" phase, which is followed by the "hold phase", during which the hold capacitor holds the reference voltage. It is during the hold phase that the analogue signal to be converted is sampled by the ADC. The ramp circuit may be further configured to disable the voltage reference source at the same time or after the step of opening the first switch and before opening the second switch of the hold unit.

The ramp circuit can further be configured to perform the following steps in the following order:

close the first ramp switch and open the second ramp switch;

open the third switch of the hold unit;

close the second switch of the hold unit; and close the first switch of the hold unit. These steps occur in a second "non-overlap" phase, when the circuit goes from the hold phase to a "sampling phase", wherein the reference voltage is sampled by the hold capacitor. The ramp circuit can be further configured to enable/activate the voltage reference source again at the same time as or before the step of opening the third switch of the hold unit and after closing the first ramp switch. If disabled during the hold phase, then the voltage reference source is activated again when going into the sampling phase.

The ramp unit can be configured to provide an adjustable tail current, and the hold unit may further comprise a low power maintenance buffer. The buffer can be connected between the hold capacitor and the third switch of the hold unit, so that the hold capacitor applies the reference voltage to the non-inverting input of the maintenance buffer, and the output of the buffer is connected to the third switch. This can allow the voltage reference source to be completely shut off during long hold events (rather than just power scaled).

According to a second aspect of the present disclosure there is provided a sensor read-out circuit comprising an analogue to digital converter, ADC, comprising a ramp circuit according to the first aspect.

The sensor read-out circuit may comprise a receiver unit (e.g. a pixel circuit) for providing a receiver signal (e.g. a pixel signal), a reference unit for providing a reference signal (e.g. a pixel reset signal), and a difference unit (typically comprising a comparator) for subtracting the reference signal from the receiver signal, wherein the ADC is configured to sample the receiver signal and the reference signal using the ramp signal provided by the ramp unit.

Preferably, the hold unit of the ramp circuit is configured to hold the reference voltage during at least two subsequent samplings of the receiver signal and the reference signal. This can ensure that the sampled noise during the reset ramp (constant ramp signal) and during the signal ramp (decreasing ramp voltage) is substantially the same and is therefore cancelled by CDS. This can provide very low RTN. The circuit is normally configured to provide the reference signal to the ramp unit. For example, the reference signal can be internally generated and provided to the ramp unit, which simply repeats/buffers the signal within the ramp unit. In some embodiments, an external reference signal or a reference signal copied from the pixel may be provided to the ramp unit.

According to a third aspect of the present invention, there is provided a sensor (e.g. a CCD or CMOS image or distance sensor) comprising a sensor read-out circuit according to the second aspect.

According to a fourth aspect of the present disclosure there is provided a method of converting an analogue signal (e.g. a pixel signal) to a digital signal, using for example an ADC with a ramp unit according to the first aspect. The method comprises sampling the analogue signal using a ramp signal, resetting the ramp signal from a hold capacitor, sampling a reference signal using the ramp signal, and subtracting the sampled reference signal from the sampled analogue signal to provide an output signal.

BRIEF DESCRIPTION OF THE PREFERRED EMBODIMENTS

Specific embodiments of the disclosure are described below with reference to the accompanying drawings, wherein FIG. 1 shows a part of a sensor read-out circuit comprising a ramp circuit;

DETAILED DESCRIPTION

Figure 1:
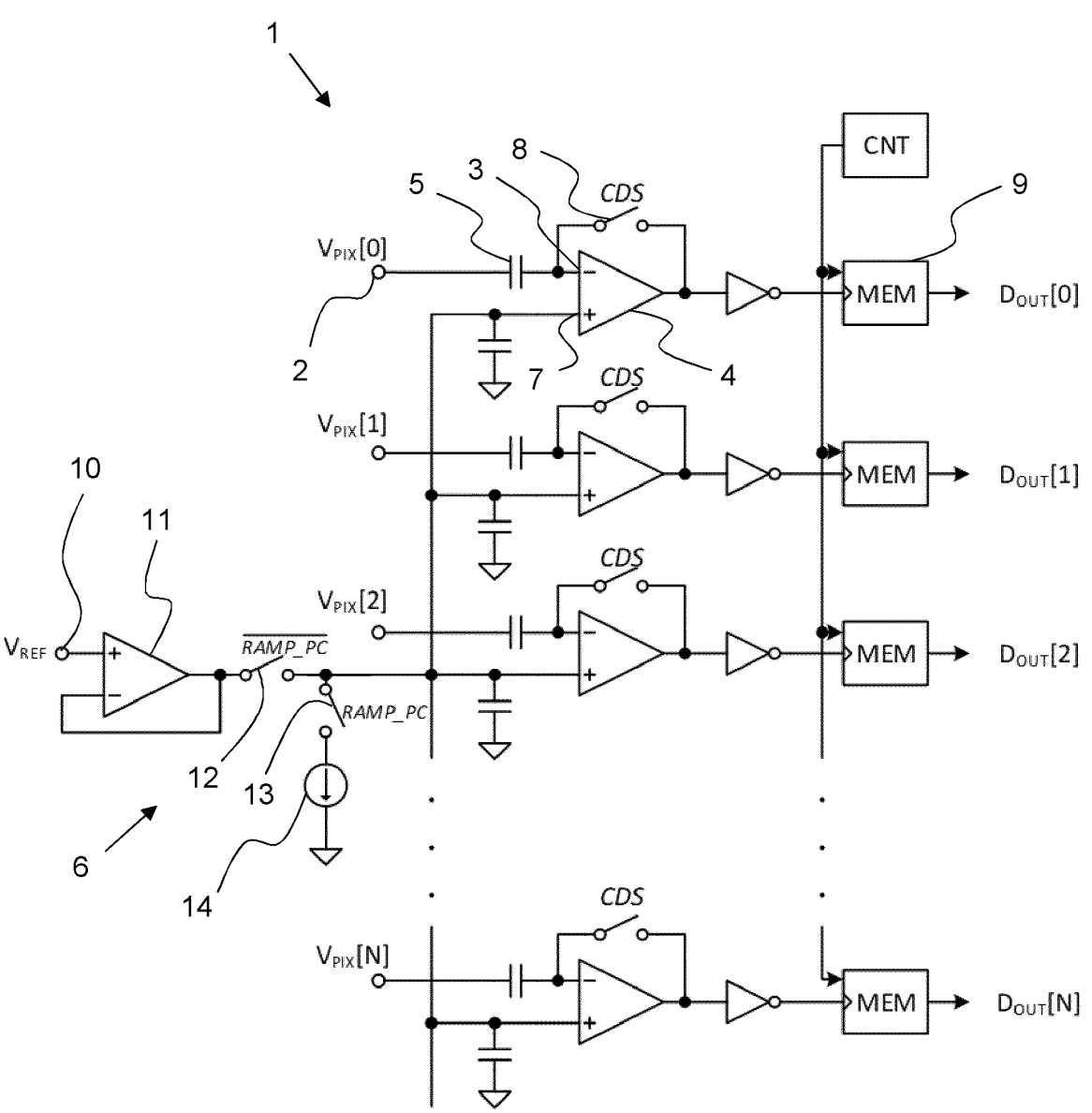

FIG. 1 shows a circuit diagram of a part of a sensor read-out circuit 1. The sensor comprises an array of pixels arranged in rows and columns. FIG. 1 shows the circuit 1 for a row of N pixels (0, 1, 2 . . . N). Looking at one pixel in the row, the pixel provides an analogue receiver signal at a point 2 connected to a first input 3 of a comparator 4 via a capacitor 5. A ramp unit 6 provides a ramp signal to the second input 7 of the comparator 4 in order to sample the receiver signal. The output of the comparator switches (e.g. 0 to 1) when the ramp signal equals the receiver signal. The magnitude (i.e. the voltage) of the receiver signal, which is typically proportional to the light intensity, can then be determined from the time it takes the ramp signal to equal the receiver signal.

After sampling the receiver signal, the circuit 1 is configured to sample a reference signal from the pixel, which provides a reference level for the pixel output. The sampled reference level can then be subtracted from the sampled receiver signal to determine the "true" pixel output. This method is called correlated double sampling (CDS). Before sampling the reference signal a CDS switch 8 is closed to set the first input 3 of the comparator 4 to a reference voltage $V_{REF}$. The sampled signals are stored in a memory unit 9. The memory unit 9 may output the digital signal/value $D_{OUT}$ to a difference unit for subtracting the sampled reference signal from the sampled pixel signal.

The ramp unit 6 comprises a voltage reference source 10 for providing the reference voltage $V_{REF}$, an operational amplifier 11 (op-amp), first and second ramp switches 12 and 13, and a current sink 14. The first ramp switch 12 is closed to a first apply a constant voltage being the reference voltage VREF to the comparator 4. The first switch is then closed and the second ramp switch 13 opened to decrease the voltage linearly from $V_{REF}$ to a voltage equal to the voltage applied to the first input 3 of the comparator. Once a signal has been sampled, the ramp switches 12 and 13 are configured to reset the voltage to $V_{REF}$ again for the next sampling.

Figure 2:
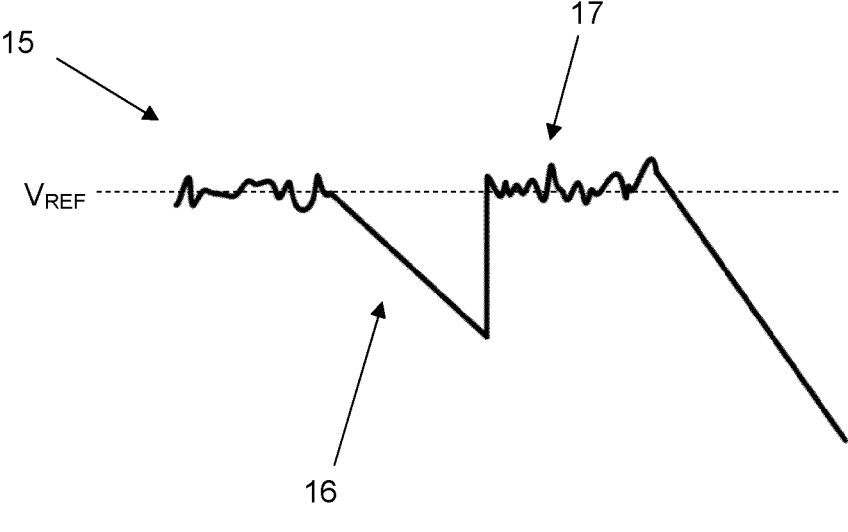
FIG. 2 shows a ramp signal during sampling and resetting.

FIG. 2 shows an example of the ramp voltage 15 VRAMP applied by the ramp unit 6 to the comparator 4 over time. The ramp unit goes through cycles of sampling 16 and of resetting 17. During sampling 16, the ramp voltage 15 decreases linearly as current is discharged through the current sink 14. Importantly, the noise of the ramp voltage 15 is different during signal sampling 16 and reset 17.

The circuit 1 samples the reference noise once during the reset ramp and again during the signal ramp. This double sampling results in un-cancelled noise converted by the ADC. This event happens once per row and can result in Row Temporal Noise (RTN). Since the noise is uncorrelated, this results not only in an increase in RTN but can also cause an increase in the reference noise by a factor of sqrt(2).

To solve this problem, embodiments disclosed herein provide a circuit comprising a hold unit connected to the ramp unit for holding a constant reference voltage during subsequent samplings of the receiver signal and the reference signal.

Figure 3:
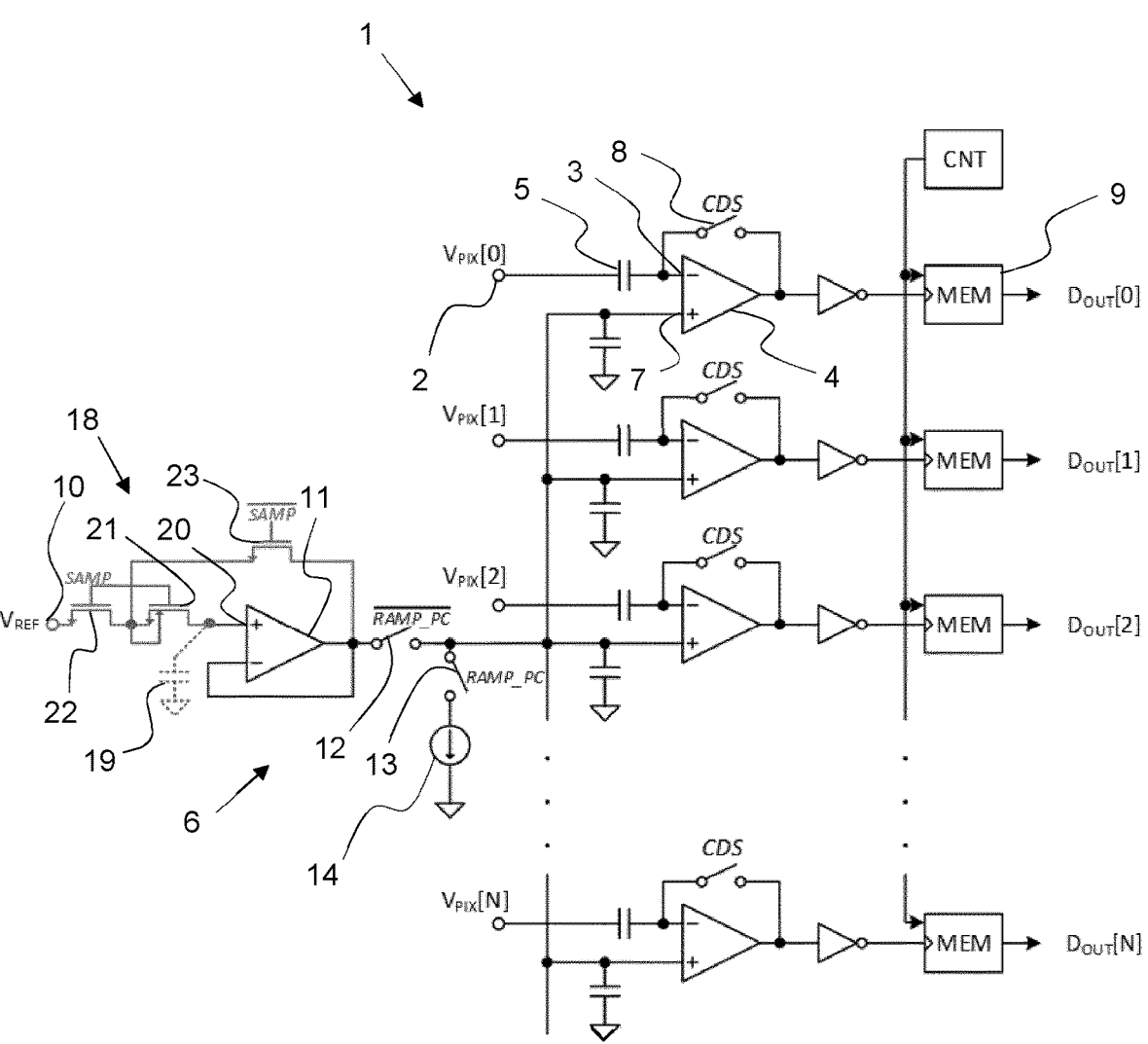
FIG. 3 shows a part of a sensor read-out circuit comprising a ramp unit according to an embodiment.

FIG. 3 shows a circuit diagram of a part of a circuit 1 comprising a ramp circuit according to an embodiment. The circuit diagram is the same as that of FIG. 1 apart from the addition of a hold unit 18, connected to the ramp unit 6. The same reference numerals have been used for equivalent or similar features in different figures to aid understanding and are not intended to limit the illustrated embodiments. By using the hold unit 18, the voltage can be sampled once at the beginning of each row reset, so that the reference noise is only sampled once. Then using CDS, the reference noise can almost be completely or perfectly cancelled. However, a classic sample and hold circuit is not very robust due to elements such as leakage (for sufficiently long row times).

The hold unit 18 comprises a holding capacitor 19, which may be an internal capacitor of a first input 20 of the op-amp 11, and three switches 21, 22 and 23 being semiconductor switches each comprising a transistor. The switches 21, 22 and 23 are arranged to allow the holding capacitor 19 to be charged by the voltage reference source 10 and then to prevent discharge/leaks from the capacitor 19 during subsequent samplings of the receiver signal and the reference signal. This enables the reference voltage $V_{REF}$ to be held constant (or with minimal decrease) over the sampling time. It also allows the voltage reference source to be disabled after charging the holding capacitor, which can lead to significant power savings. The voltage reference source may be disabled at row or frame level. For example, for 1 fps event detection, the voltage reference source 10 may only be active at the start of the frame during sampling.

The first switch 21 is connected directly to the first input 20 of the op-amp 11 and to the capacitor 19 on one side, and to the second switch 22 on the other side. The second switch 22 is connected to the voltage reference source, such that the reference voltage $V_{REF}$ is applied to the first input 20 of the op-amp 11 and to the capacitor 19 when both the first switch 21 and the second switch 22 are closed. The third switch 23 is connected to the output of the op-amp 11 on one side and to the first and to the second switches 21 and 22 on the other side. Hence, both the first switch 21 and the second switch 22 are connected to the output of the op-amp when the third switch 23 is closed.

Figure 4:
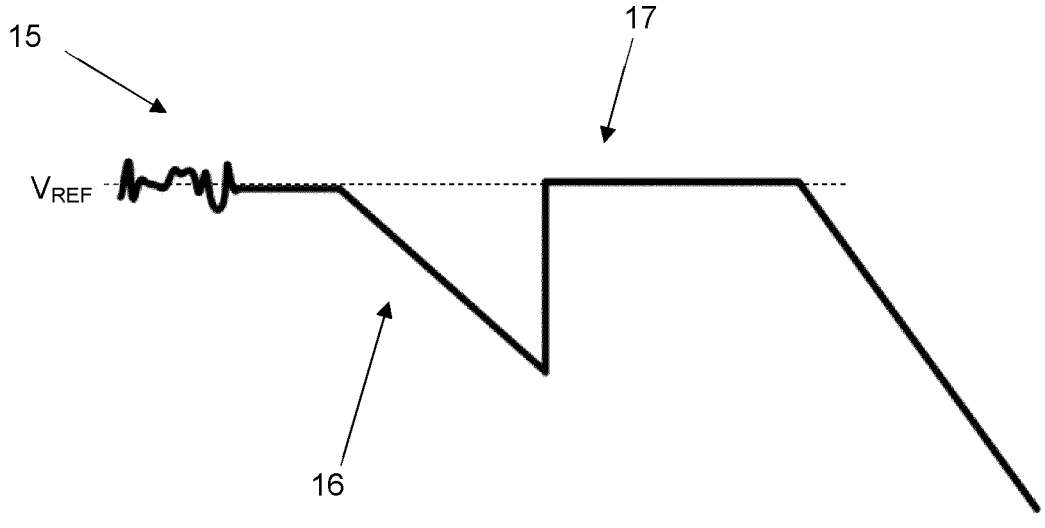
FIG. 4 shows a ramp signal from the ramp unit of the embodiment.

FIG. 4 shows the ramp voltage 15 applied to the second input 7 of the comparator 4 in a circuit 1 comprising a hold unit 18 according to an embodiment. The noise is now the same for the signal sampling 16 and the reset 17.

Figure 5:
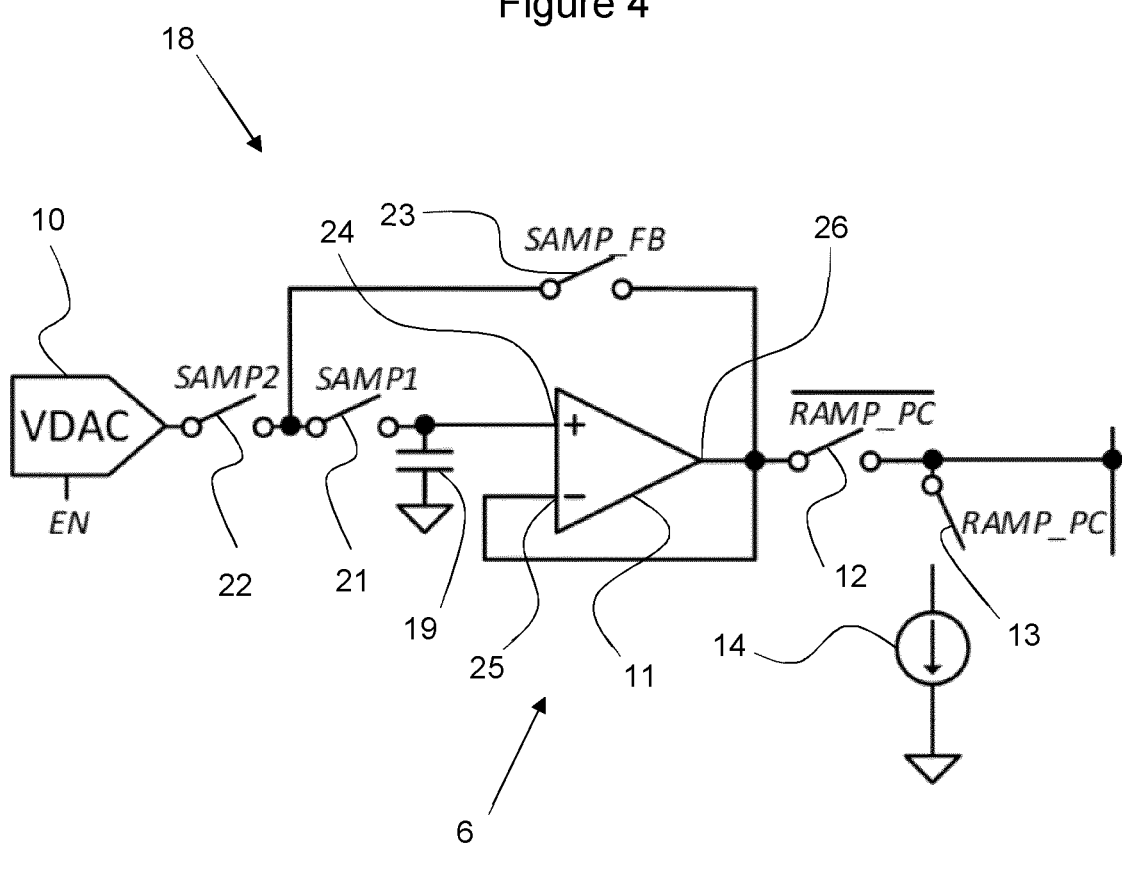
FIG. 5 shows a ramp circuit comprising a ramp unit and a hold unit according to an embodiment.

FIG. 5 shows a circuit diagram of a part of a circuit according to an embodiment comprising a ramp unit 6 and a hold unit 18. The ramp unit 6 comprises an op-amp 11 with a first (non-inverting) input 24, a second (inverting) input 25 and output 26. The ramp unit further comprises a first ramp switch 12 connected directly to the output 26 of the op-amp 11 and a second ramp switch 13 connected to a current sink 14. The circuit 1 is configured to activate the first and second ramp switches 12 and 13 in order to sample a receiver signal and then reset the ramp voltage. The ramp unit 6 further comprises a voltage reference source 10 being a voltage digital to analogue converter (VDAC).

Figures 6A, 6B:
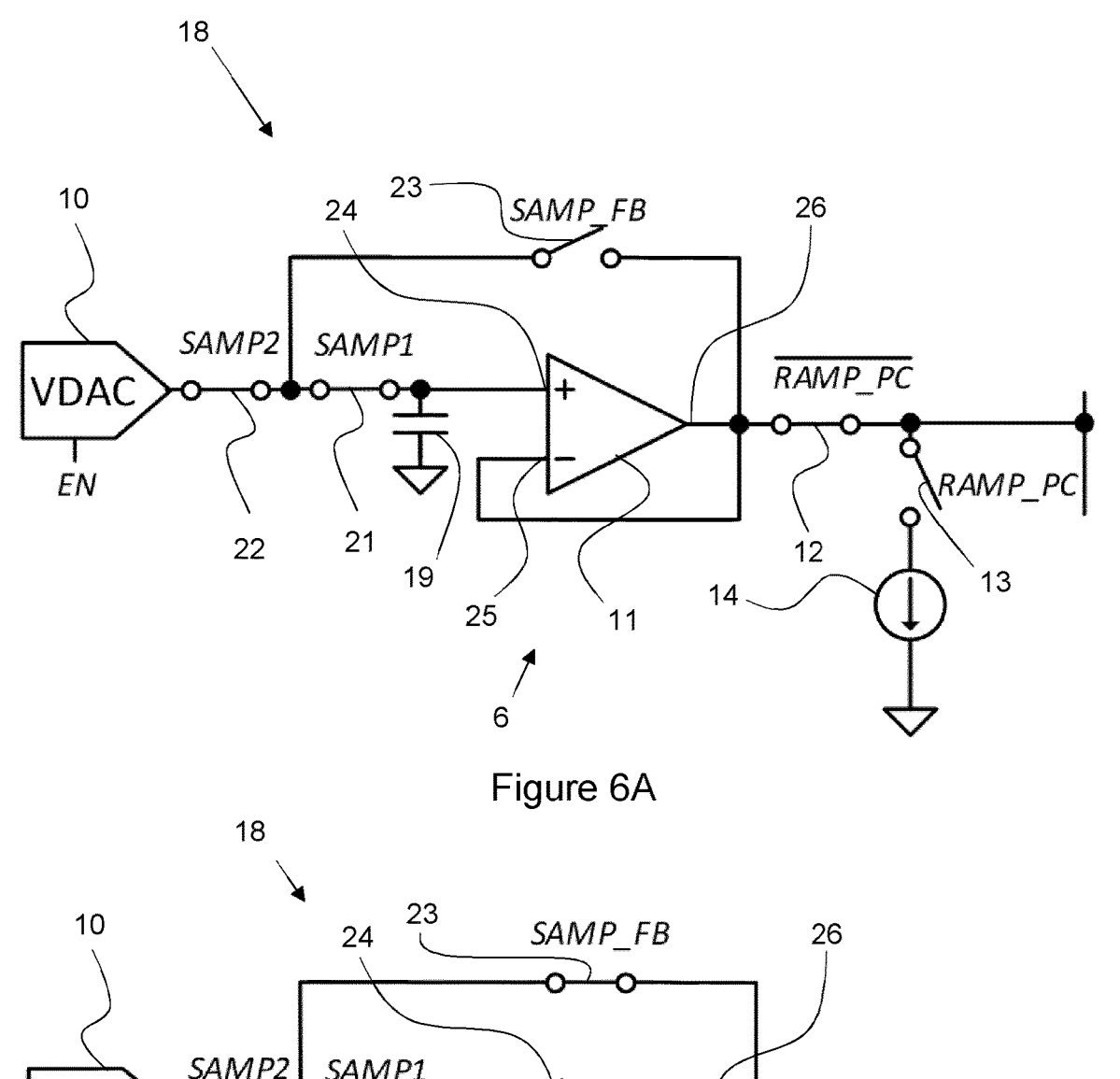
FIG. 6A shows the ramp circuit in a sample phase.
FIG. 6B shows the ramp circuit in a non-overlap phase.
Figures 6C, 7:
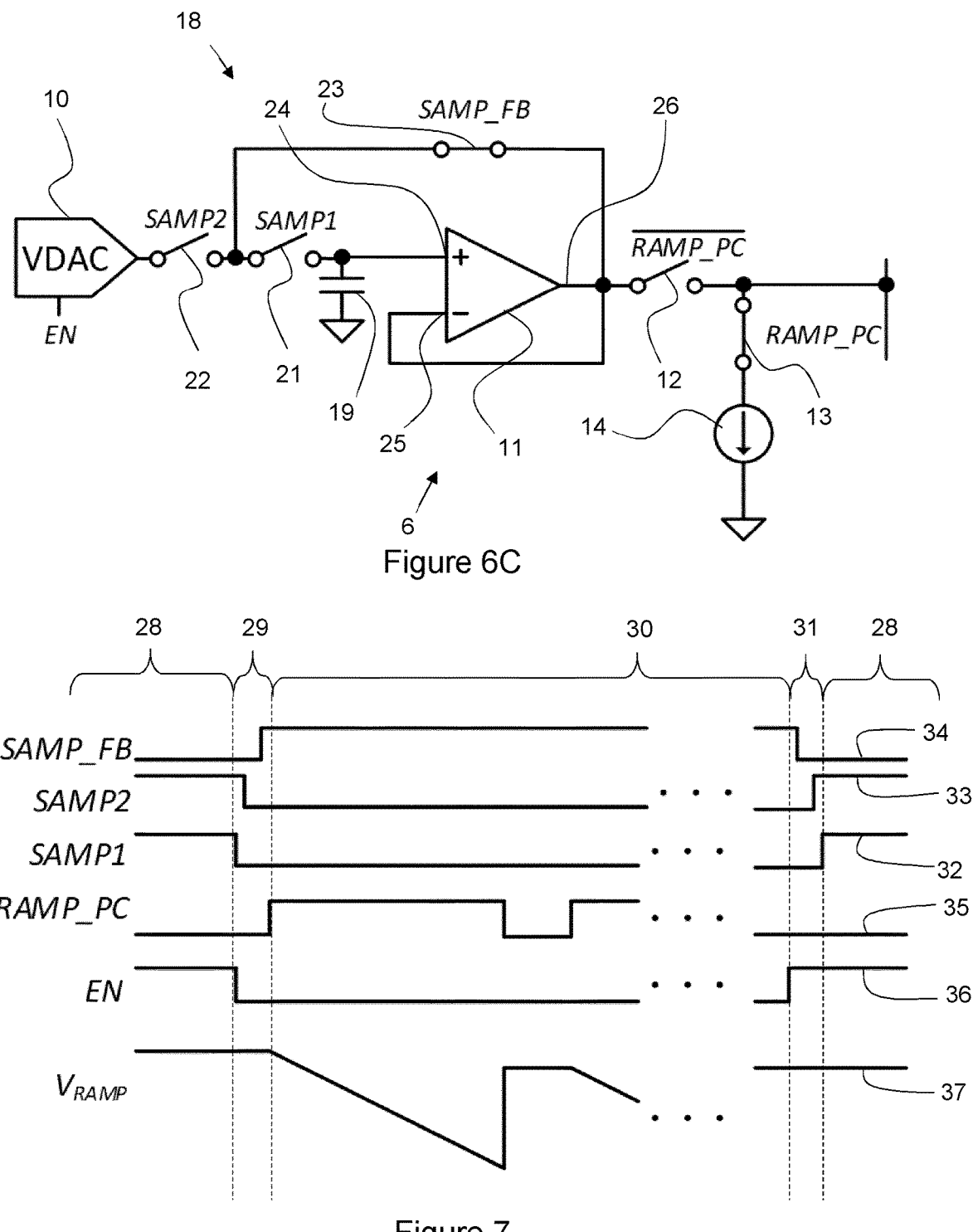
FIG. 6C shows the ramp circuit in a hold phase.
FIG. 7 shows a graph illustrating the order of activation of switches of the ramp circuit and the resulting ramp signal.

FIGS. 6A to 6C illustrate a sequence of activating the switches of the ramp unit 6 and connected hold unit 18 of a part of a circuit according to an embodiment. The part of the circuit comprises the same elements as illustrated in FIG. 5.

FIG. 6A illustrates the "sample phase", wherein the first switch 21 and second switch 22 of the hold unit 18 are closed, while the third switch 23 is open. The reference voltage $V_{REF}$ is therefore applied by the voltage reference source 10 to the hold capacitor 19 (charging) and to the non-inverting input 24 of the op-amp 11. The first ramp switch 12 is also closed so that the output of the op-amp 11 is applied to the comparators (not shown).

FIG. 6B illustrates the "non-overlap phase", wherein the first and second switches 21 and 22 of the hold unit 18 are open so that the voltage reference source 10 is disconnected and so that the capacitor 19 is isolated. The non-overlap phase begins when the first switch 21 of the hold unit 18 is opened. At this stage, the voltage reference source can be switched off in order to reduce power/energy. The reference voltage is held by the capacitor 19. The first ramp switch 12 is still closed so that the output voltage is applied to the comparators (not shown). The second ramp switch 13 is open, so that the applied voltage is substantially constant.

FIG. 6C illustrates the "hold phase", which starts when the ramp switches 12 and 13 are switched (the first ramp switch 12 is opened and the second ramp switch 13 is closed). The ramp voltage (at the comparators) starts to decrease as current flows out the current sink 14. Meanwhile, the hold capacitor 19 remains at VREF. The circuit is configured to provide no or negligible leakage. On one side, the impedance of the op-amp input 24 is theoretically infinite, and in practice draws a negligible amount of current, and so the capacitor 19 cannot leak through the op-amp 11. On the other side, the first switch 21 of the hold unit 18 is a semiconductor switch and therefore could technically draw a non-negligible amount of current when there is potential difference across it. However, the third switch 23 of the hold unit 18 is now closed and applies the output of the op-amp 11 to the source and body of first switch 21, which therefore balances the voltage on either side of the first switch 21, and thereby prevents leakage through the first switch 21.

In the hold phase, once the receive signal has been sampled, the ramp switches 12 and 13 are activated again to reset the ramp voltage to VREF from the hold capacitor 19 in order to then sample the reference signal (for subtracting from the receiver signal).

FIG. 7 shows a graph illustrating the three different phases of the circuit, i.e. the sample phase 28, the non-overlap phase 29 and the hold phase 30. There is also a second non-overlap phase 31, in which the switches are reset to start a new sample phase 28. The graph shows the switching states 32, 33, and 34 (e.g. "1" or "0") for the three switches 21, 22 and 23 of the hold unit 18, and the switching state 35 second ramp switch 13 (which is in the opposite state to the first ramp switch 12), as well as the state 36 of the voltage reference source 10 (being on or off), and the ramp voltage 37 applied to the comparator for sampling the receiver signal and the reference signal.

In the sample phase 28, the switching state 32 of the first switch 21 and the switching state 33 of the second switch 22 are "1", which means that the switches 21 and 22 are closed and the capacitor 19 is sampling the reference voltage $V_{REF}$ from the voltage reference source 10. In the subsequent non-overlap phase 29, the first switch 21 is opened first (switching state 32 changes to 0), followed by the second switch 22 (switching state 33 changes to 0). After the second switch 22 is opened, the third switch 23 is closed (switching state 34 changes to 1) followed by the second ramp switch 13 (switching state 35 changes to 1). This order in which the switches are activated can reduce disturbances on the held node. The "non-overlap" times can be, for example, buffer delays or programmable clock periods.

In the hold phase 30, only the ramp switches 12 and 13 are operated to sample the receiver signal and reference signal by controlling the ramp voltage 37, while the reference voltage $V_{REF}$ is held substantially constant by the capacitor 19.

Since a conversion happens twice, any amplifier output disturbance due to the sudden load change when releasing the first ramp switch 12 will, likewise, be seen twice. These effects cancel with CDS since the disturbance will be the same, to a first-order, in a single conversion (i.e. it is deterministic). If instead, for example, the third switch 23 (SAMP_FB) of the hold unit 18 was held open until a moment after the ramp switch 12 opens, then the floating well node (i.e. the body/source connection of the first switch 21) would see no amplifier disturbance in the first conversion, but some during the second, resulting in a potentially significant error in the final output.

Figure 8:
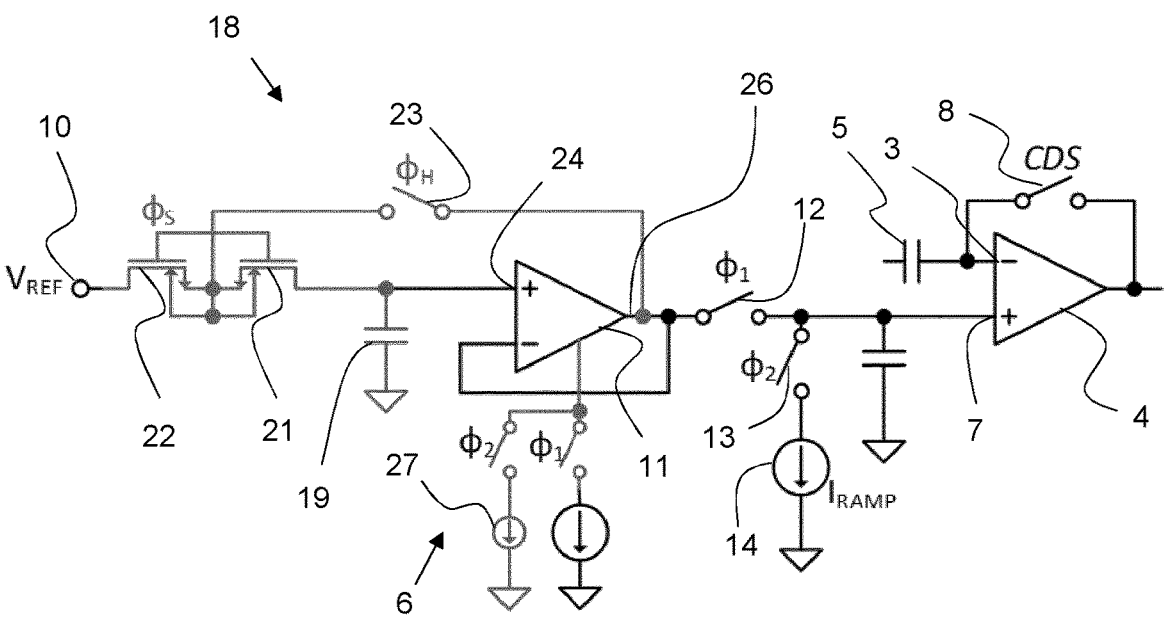
FIG. 8 shows a ramp circuit according to another embodiment for providing a tail current.
Figure 9:
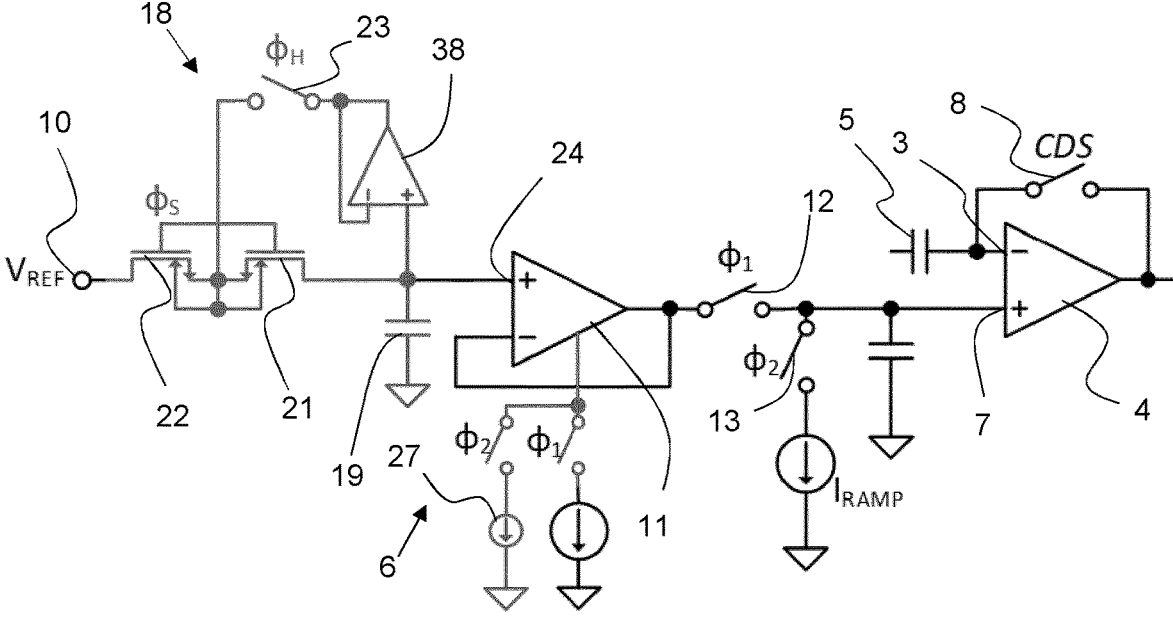
FIG. 9 shows a ramp circuit according to another embodiment comprising a low power maintenance buffer.

FIGS. 8 and 9 show circuit diagrams of a part of a pixel read-out circuit comprising further embodiments of the hold unit 18, which comprises further components for improving performance.

FIG. 8 illustrates an embodiment comprising hardware re-use with an adjustable tail current. The ramp unit comprises two switches connected to the "tail" of the op-amp, and an additional current source 27. The tail current dictates the power draw of the amplifier 11 so by adding a smaller current source 27 that can be switched into the circuit, the current draw of the amplifier 11 can be reduced while maintaining some minimum level of drive strength. A benefit of this implementation is that the amplifier 11 maintains internal bias points to ensure a fast startup (as opposed to when disabling it entirely). Hence, the tail current can be scaled when not driving the reference signal $V_{REF}$ out onto the ramp line. Doing so allows for power scaling of the reference buffer during long hold events (for example 1 fps event detect mode).

FIG. 9 illustrates an embodiment a small, low power maintenance buffer 38 to allow for the reference buffer (i.e. the op-amp 11) to be completely shut off during long hold events (rather than power scaled). This implementation also relaxes kick-back concerns to a degree since the output of the op-amp no longer sees a large load change. However, this embodiment comes with an area penalty due to the need for an additional buffer.

Figure 10:
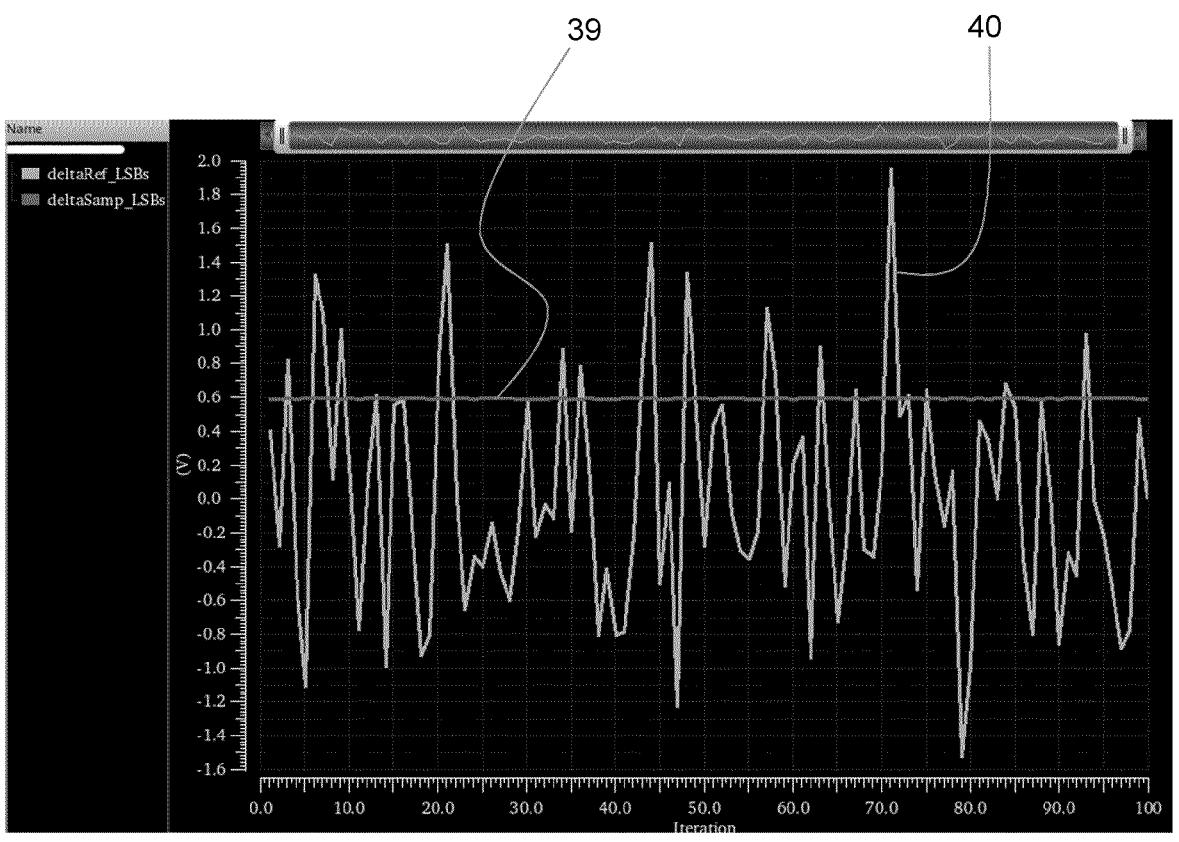
FIG. 10 shows a graph with simulated noise for a conventional ramp circuit and for a ramp circuit according to an embodiment.

FIG. 10 shows a graph of the simulated output signal from a conventional ramp circuit 39 and of a ramp circuit 40 according to an embodiment. In the circuit model all noise sources were disabled except for the reference. 100 transient runs were performed and the average and rms values of the ramp voltages post-CDS were plotted (start of reset ramp minus start of signal ramp These were then scaled relative to the LSB of the ADC.

The random variation has clearly been cancelled in the proposed architecture 40. However, there is an increase in the mean value from 0 LSBs to ~0.6 LSBs. This is due to charge injection and clock feedthrough. During image read-out, this should appear as an offset on every row since the mechanism will be consistent from row-to-row. An increase in FPN is therefore not be expected. Instead there would just be a frame offset of ~½ LSB.

Although specific embodiments have been described above, the claims are not limited to those embodiments. Each feature disclosed may be incorporated in any of the described embodiments, alone or in an appropriate combination with other features disclosed herein.

The invention claimed is:

1. A ramp circuit for an analogue to digital converter (ADC) the ramp circuit comprising:
    a ramp unit configured to provide a ramp signal usable for comparing to an analogue signal; and
    a hold unit connected to the ramp unit and configured to hold a reference voltage for resetting the ramp signal between subsequent samplings of the analogue signal, wherein the hold unit comprises:
        a hold capacitor for holding the reference voltage and connected to an input of an op-amp;
        a first switch connected to the hold capacitor; and
        a second switch connected in series between the first switch and a reference voltage source, so that the hold capacitor and the input of the op-amp are connected to the reference voltage source when the first and second switches are closed; and
        a third switch connected between an output of the op-amp and the first switch and the second switch, such that the first and second switches are connected to the output of the op-amp when the third switch is closed.

2. The ramp circuit according to claim 1, wherein the ramp unit comprises a first ramp switch for selectively applying a ramp voltage to a comparator, and a second ramp switch connected to a current sink for selectively decreasing the ramp voltage applied to the comparator.

3. The ramp circuit according to claim 2, wherein the first and second ramp switches are inversely coupled, so that the first ramp switch is open when the second ramp switch is closed and vice versa.

4. The ramp circuit according to claim 2, wherein the ramp circuit is configured to perform the following steps in the following order:
    open the first switch of the hold unit;

open the second switch of the hold unit;

close the third switch of the hold unit; and open the first ramp switch and close the second ramp switch.

5. The ramp circuit according to claim 4, wherein the ramp circuit is further configured to disable the voltage reference source at the same time or after the step of opening the first switch and before opening the second switch of the hold unit.

6. The ramp circuit according to claim 2, wherein the ramp circuit is configured to perform the following steps in the following order:

close the first ramp switch and open the second ramp switch;

open the third switch of the hold unit;

close the second switch of the hold unit; and close the first switch of the hold unit.

7. The ramp circuit according to claim 6, wherein the ramp circuit is further configured to enable the voltage reference source at the same time or before the step of opening the third switch of the hold unit and after closing the first ramp switch.

8. The ramp circuit according to claim 1 wherein the ramp unit is further configured to provide an adjustable tail current.

9. The ramp circuit according to claim 1, wherein the hold unit further comprises a low power maintenance buffer.

10. A sensor read-out circuit comprising:

an analogue to digital converter (ADC) comprising the ramp circuit according to claim 1.

11. The sensor read-out circuit according to claim 10, further comprising:

a receiver unit for providing a receiver signal;

a reference unit for providing a reference signal; and a difference unit for subtracting the reference signal from the receiver signal, wherein the ADC is configured to sample the receiver signal and the reference signal using the ramp signal provided by the ramp unit.

12. The sensor read-out circuit according to claim 11, wherein the hold unit of the ramp circuit is configured to hold the reference voltage during at least two subsequent samplings of the receiver signal and the reference signal.

13. The sensor read-out circuit according to claim 11, wherein the sensor read-out circuit is configured to provide the reference signal to the ramp unit.

14. A sensor comprising the sensor read-out circuit according to claim 11.

15. A method of converting an analogue signal to a digital signal, the method comprising:

sampling the analogue signal using a ramp signal;

resetting the ramp signal from a hold capacitor;

sampling a reference signal using the ramp signal;

receiving a receiver signal:

holding the sampled reference signal during at least two subsequent samplings of the receiver signal and the reference signal; and subtracting the sampled reference signal from the sampled analogue signal to provide an output signal.

\* \* \* \* \*